(12) United States Patent
Ronning et al.

(10) Patent No.: US 6,423,441 B1
(45) Date of Patent: Jul. 23, 2002

(54) BATTERY PACK SIGNAL ROUTING SYSTEM

(75) Inventors: Jeffrey J. Ronning, Fishers; Robert C. Beer, Noblesville, both of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/482,400

(22) Filed: Jan. 12, 2000

(51) Int. Cl.[7] .............................. H01M 2/12; H01R 3/00; H05K 1/00
(52) U.S. Cl. .............................. 429/82; 429/7; 429/149; 429/71; 439/500; 361/748
(58) Field of Search .............................. 429/82, 89, 124, 429/7, 123, 149, 72, 71; 361/749, 748, 752; 439/500

(56) References Cited

U.S. PATENT DOCUMENTS

| | | | |
|---|---|---|---|
| 5,350,317 A | * 9/1994 | Weaver et al. | ............ 439/500 |
| 5,588,884 A | 12/1996 | Rudoy et al. | |
| 5,639,571 A | 6/1997 | Waters et al. | |
| 5,805,423 A | 9/1998 | Wever et al. | |
| 5,863,674 A | 1/1999 | Yamanaka | |
| 5,883,493 A | * 3/1999 | Koenck | ............ 320/114 |
| 5,895,728 A | 4/1999 | Walker et al. | |
| 5,999,410 A | * 12/1999 | Weiler | ............ 361/749 |
| 6,016,046 A | * 1/2000 | Kaite et al. | ............ 320/108 |
| 6,027,535 A | * 2/2000 | Eberle et al. | ............ 631/690 |
| 6,040,684 A | * 3/2000 | Mitchell | ............ 320/139 |
| 6,165,639 A | * 12/2000 | Deslyper et al. | ............ 429/99 |

* cited by examiner

Primary Examiner—Stephen Kalafut
Assistant Examiner—R Alejandro
(74) Attorney, Agent, or Firm—Margaret A. Dobrowitsky

(57) ABSTRACT

A battery pack is provided that includes a case and at least one battery module disposed within the case. The battery pack further includes a flexible circuit to which the battery module may be electrically coupled. The flexible circuit includes a plurality of airflow openings configured to distribute air throughout the battery pack. In a preferred embodiment, the airflow openings vary in size relative to their proximity to an air source.

2 Claims, 4 Drawing Sheets

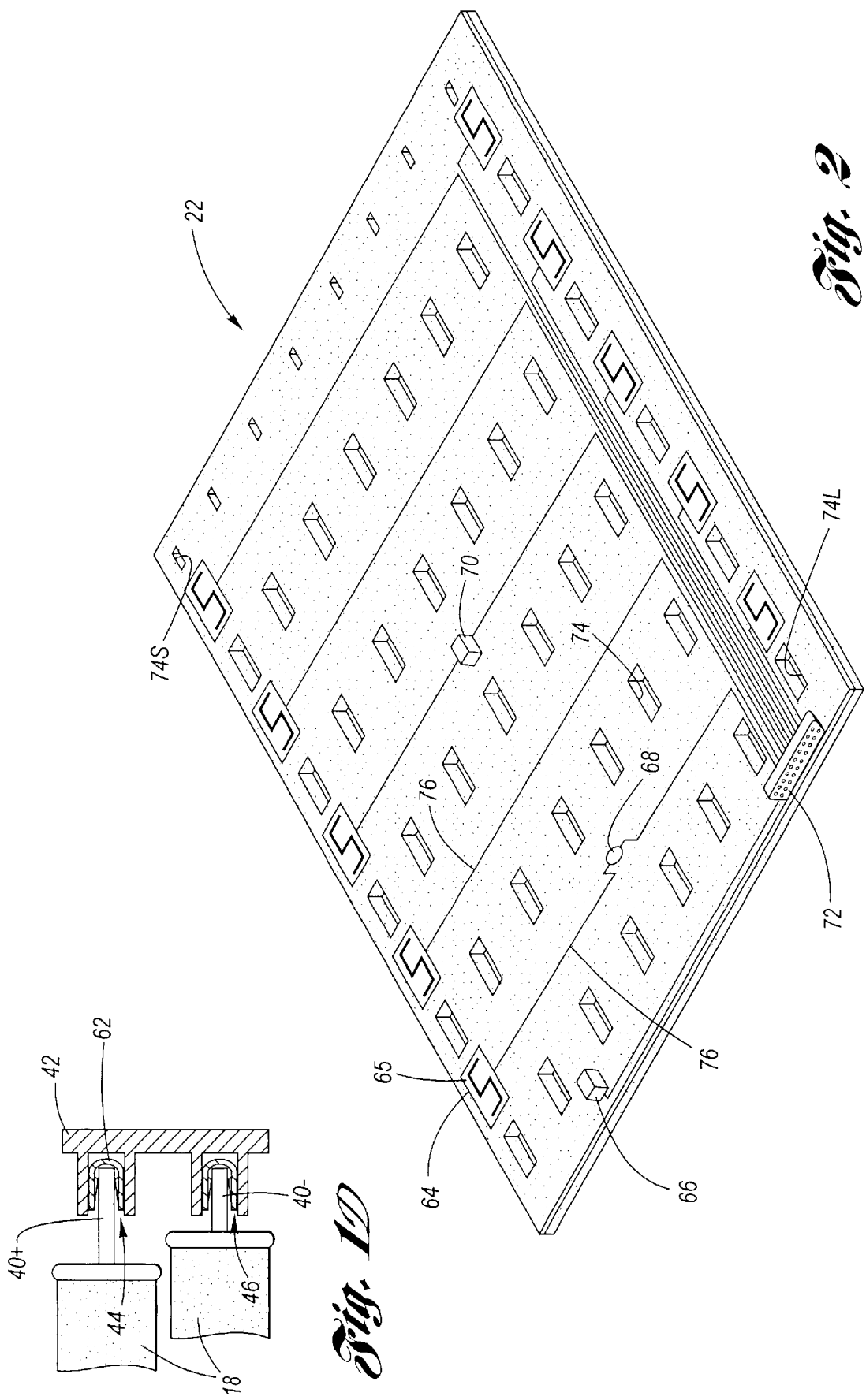

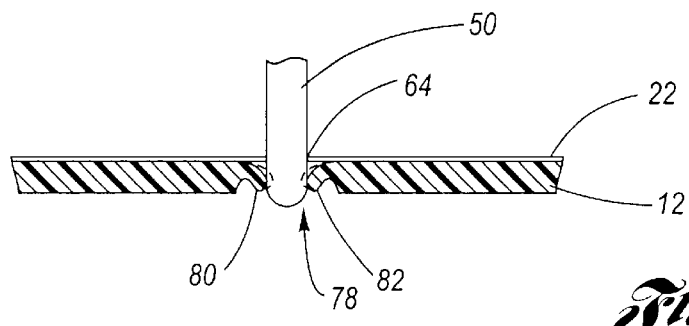
Fig. 3
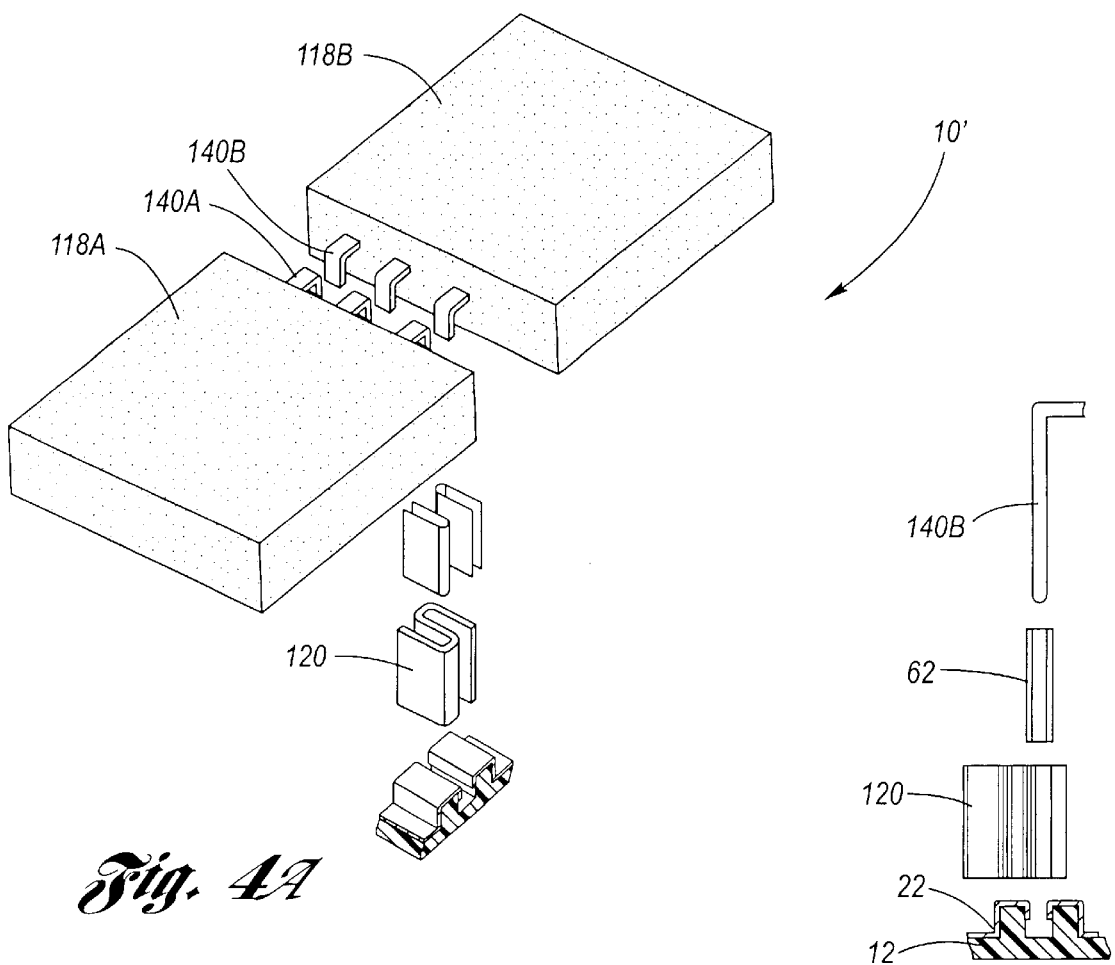
Fig. 4A
Fig. 4B
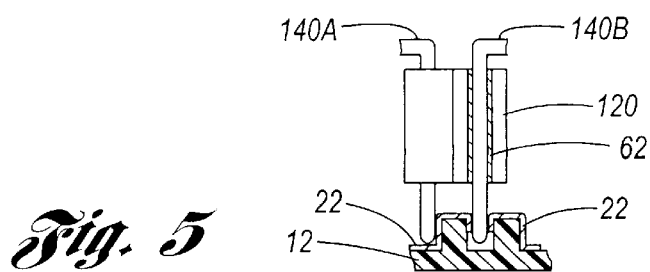
Fig. 5

BATTERY PACK SIGNAL ROUTING SYSTEM

BACKGROUND OF THE INVENTION

1. Field of the Invention

This invention relates to a battery pack signal routing system.

2. Disclosure of Related Art

A conventional battery pack includes one or more battery modules disposed within a case and connected together, as seen by reference to U.S. Pat. No. 5,639,571 to Waters et al. Waters et al. disclose that the battery pack may also include a tray disposed within the case to support and orient the battery modules. Even though the battery modules are connected together in a string, there remains the need to sense voltage levels at each battery module. Waters et al. disclose an electrical wiring harness that includes individual cables or lead wires that are routed to the terminals of each module to provide for power transfer and to perform voltage sensing and other operations. In conventional systems, the lead wires may be attached to the terminals by various means including threaded fasteners and ring terminals or by threading multiple wires through a terminal crimp. Due to the use of individual cables, lead wires and fasteners, a relatively large amount of assembly time is required to assemble conventional battery packs. Further, the large number of parts and heavy reliance on human assembly renders conventional battery packs subject to damage during assembly and, therefore, reduces reliability. These problems are magnified when fuses and resistors or other current limiting devices are included in the battery. The fuses must be electrically isolated from various wires. The resistors must be spliced into the wires and must also be electrically isolated.

Conventional battery packs must also be configured to distribute air between battery modules and throughout the battery itself. Waters et al. disclose a housing or case that is molded to create baffles or openings to control airflow within the battery, thereby increasing the complexity and cost of producing the battery case. Further, it is difficult to make adjustments to airflow within the battery pack because of the complexity of the mold design and the difficulty in modifying the pre-molded case and tray.

To overcome some of the above-identified problems, a battery has been proposed that includes a rigid, printed circuit board to which one or more battery modules may be electrically connected. The circuit board may be used to sense voltage levels of the battery modules, thereby reducing and/or eliminating the need for many lead wires and fasteners. Although the proposed battery represents an improvement relative to many conventional batteries, the proposed battery fails to account for the required distribution of air among the battery modules. As a result, the proposed battery continues to suffer from the above-identified design problems associated with controlling airflow in the battery.

There is thus a need for a battery pack that will minimize or eliminate one or more of the above-mentioned deficiencies.

SUMMARY OF THE INVENTION

The present invention provides an improved battery pack.

A battery pack in accordance with the present invention includes a case, a flexible printed circuit supported within the case, and a battery module electrically connected to the flexible printed circuit. The battery pack is characterized in that the flexible printed circuit includes a plurality of airflow openings extending therethrough. In a preferred embodiment, the airflow openings vary in size relative to their proximity to an air source in order to maintain a relatively uniform airflow throughout the battery pack.

One advantage of a battery pack in accordance with the present invention is the use of a flexible printed circuit to perform voltage sensing, temperature sensing, current limiting, and other functions within the battery pack. The use of a flexible printed circuit reduces and/or eliminates the need for many individual cables, lead wires, and fasteners. As a result, the inventive battery pack requires less assembly time as compared to most conventional battery packs and is more reliable.

Another advantage of a battery pack in accordance with the present invention is that the flexible printed circuit may be used to control airflow within the battery pack. By using the flexible printed circuit to control airflow, the complexity and cost of the case and/or tray are significantly reduced. Further, adjustments to airflow within the battery pack may be made more easily than in conventional configurations.

A battery pack in accordance with the present invention may also include a buss interface to connect two or more battery modules within the battery pack. In one embodiment of the present invention, the buss interface includes a buss blade extending into the flexible printed circuit. In a second embodiment of the present invention, the buss interface comprises a substantially S-shaped conductive member operative as a female-type connector configured to engage the male-type terminals of two battery modules. The terminals of the two battery modules extend through the conductive member and into the flexible printed circuit. Each of the disclosed buss interfaces provides a compact and efficient means for establishing module to module power connections while allowing the flexible printed circuit to sense voltage levels within the battery pack (i.e., at each module-to-module connection).

These and other advantages of this invention will become apparent to one skilled in the art from the following detailed description and the accompanying drawings illustrating features of this invention by way of example.

BRIEF DESCRIPTION OF THE DRAWINGS

FIG. 1D is a partial sectional view of a connection between adjacent battery modules and a buss interface, with portions broken away.

FIG. 2 is a perspective view of the flexible printed circuit of the battery pack of FIG. 1A.

FIG. 3 is a sectional view illustrating the electrical connection of the buss interface, and the flexible printed circuit of FIG. 1A.

FIG. 4A is an exploded perspective view of a portion of a second battery pack embodiment of the present invention.

FIG. 4B is a simplified, front plan view of the battery pack of FIG. 4A, showing the relative orientation of the components thereof.

FIG. 5 is a sectional view illustrating the electrical connection of the buss interface, the flexible printed circuit, and the battery module of FIGS. 4A and 4B.

DETAILED DESCRIPTION OF THE PREFERRED EMBODIMENT

Figure 1A:
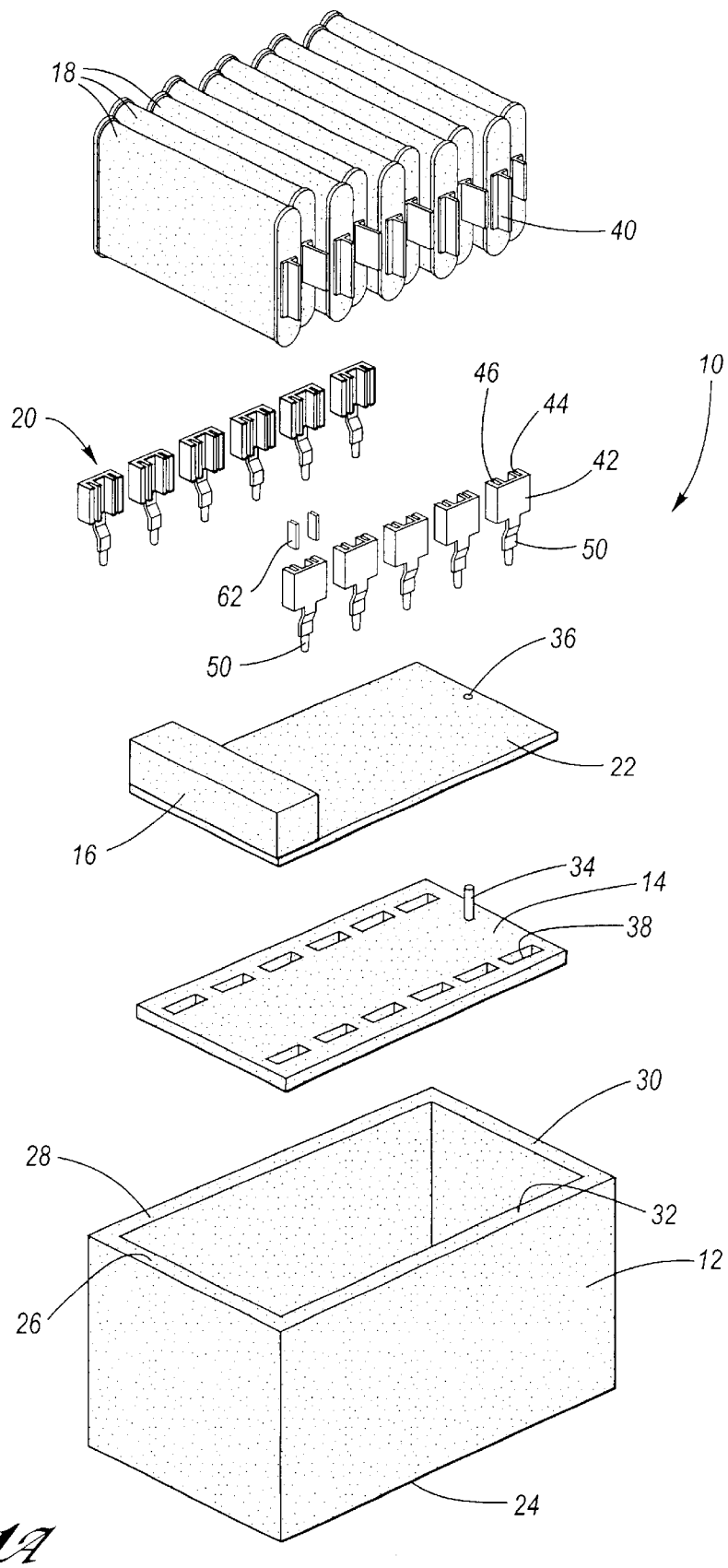
FIG. 1A is an exploded perspective view of a battery pack in accordance with a first embodiment of the present invention.

Referring now to the drawings wherein like reference numerals are used to identify identical components in the various views, FIG. 1A illustrates a battery pack 10 in accordance with a first embodiment of the present invention. Battery pack 10 may be used to power various vehicle systems in an automotive vehicle including lighting and ignition systems, although it should be understood that battery pack 10 may be used in a variety of applications. Battery pack 10 may include a case 12, a tray 14, a controller 16, a plurality of battery modules 18, a plurality of buss interfaces 20, and a flexible printed circuit 22.

Case 12 is provided to protect the internal components of battery pack 10 from foreign objects and elements and to protect systems disposed external and proximate to case 12 from damage in the event of a failure of battery pack 10. Case 12 may be molded using a glass-filled polypropylene material. Case 12 may include a bottom wall 24, side walls 26, 28, 30, 32, and a top wall or cover (not shown). In the illustrated embodiment, case 12 is rectangular in shape. It should be understood by those of ordinary skill in the art, however, that case 12 may assume a variety of shapes and be configured to accomplish conventional functions such as battery component support and orientation and airflow management.

Figure 1B:
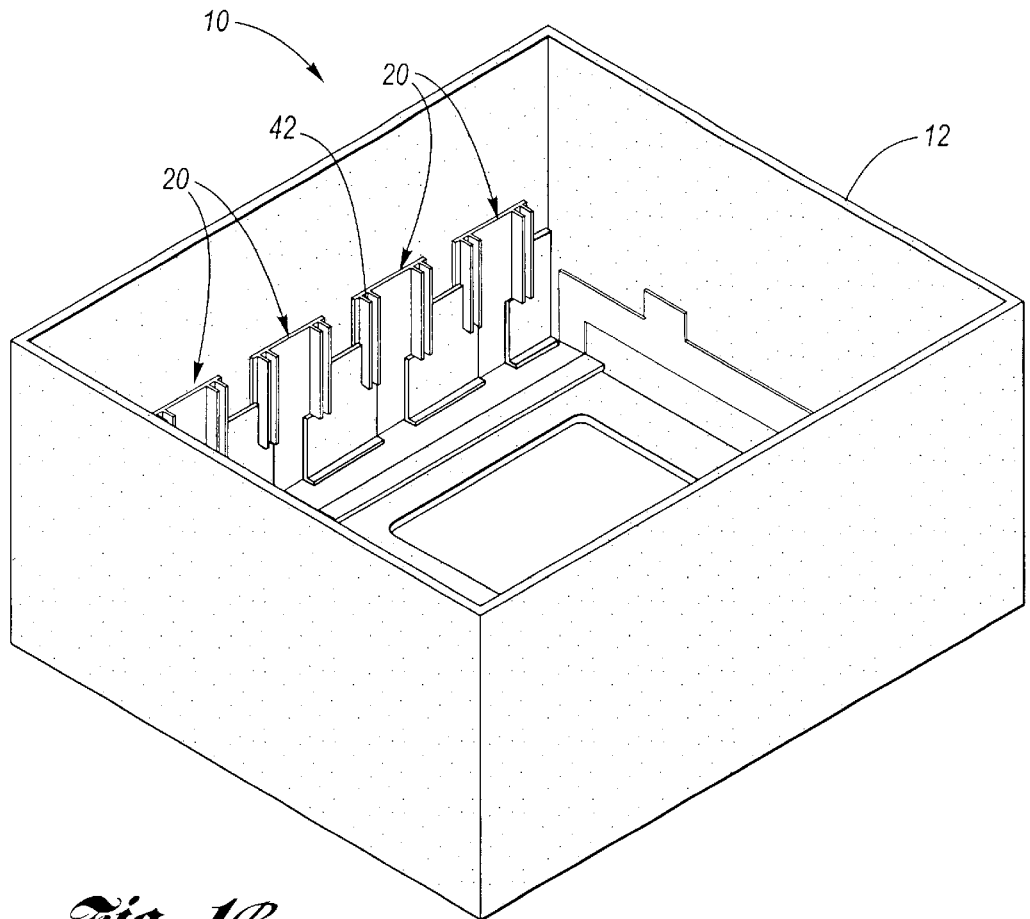
FIG. 1B is a perspective view of the first embodiment shown in FIG. 1A in a partially assembled state.

FIG. 1B shows further features of case 12, including a plurality of grooves and channels formed on an inner wall thereof configured to cooperate with flange portions of buss interfaces 20 to retain and position such buss interfaces. In FIG. 1B, battery pack 10 is in a partially assembled state, the buss interfaces 20 being installed into case 12.

Referring again to FIG. 1A, tray 14 may also be provided to support and orient the internal components of battery pack 10 and to control the distribution of airflow within battery pack 10. However, tray 14 need not be included within battery pack 10 if such functions can be adequately performed by other components of battery pack 10. Tray 14 may be made using a conventional plastic. Tray 14 may include a locating pin 34 configured to be received within a corresponding aperture 36 within flexible printed circuit 22 to orient circuit 22. Tray 14 may also include a plurality of apertures 38 to direct airflow within battery pack 10.

Controller 16 is provided to monitor the condition of battery modules 18 and to control battery pack 10 responsive to measurements of voltage levels, temperatures, and other parameters within battery pack 10. Controller 16 may comprise conventional apparatus known in the art.

Battery modules 18 provide power to electrical systems external to battery pack 10. Modules 18 may comprise lithium polymer batteries, nickel cadmium batteries, nickel metal hydride batteries or other known storage cell technology. Each module 18 includes a pair of terminals, designated terminals 40(−) and 40(+) in the Figures (best shown in FIG. 1C) extending from respective ends of the module 18.

Figure 1C:
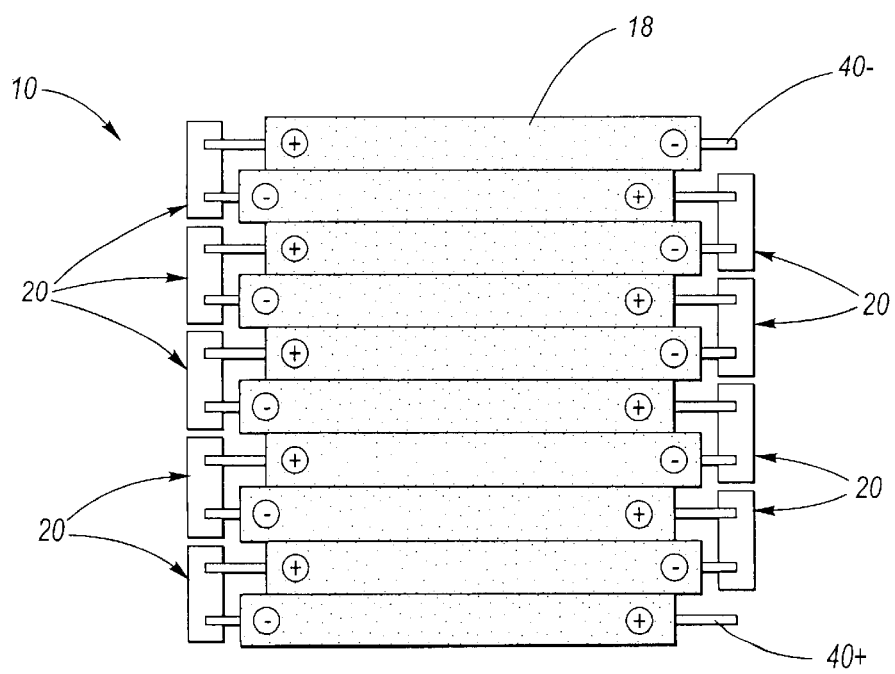
FIG. 1C is a simplified, top plan view of the first embodiment shown in FIG. 1A, fully assembled, with portions omitted for clarity.

FIG. 1C shows battery pack 10 when assembled, with portions omitted for clarity. The modules 18 are shown connected in-series by edge connections using buss interfaces 20. These edge connections connect positive and negative polarity terminals of adjacent cells 18. As connected, the overall positive terminal of the battery pack 10 is the terminal designated 40+ at the lower right hand corner of FIG. 1C. The overall negative terminal of battery pack 10 is the terminal designated 40− at the upper right hand corner of FIG. 1C.

Each buss interface 20 is provided to electrically couple adjacent modules 18 together in a series relationship and, to align modules 18 within case 12. Interfaces 20 may be made from an electrically conductive material such as copper or brass. Interfaces 20 each include a respective plate 42, a plurality of short transverse walls defining a pair of channels (or, in other words, female-type terminals) 44 and 46, and a blade 50. This is best shown in FIG. 1D.

As shown in FIG. 1D, female terminals 44 and 46 are configured to receive male-type blade terminals 40(−) and 40(+) extending from modules 18. Terminals 44 and 46 are disposed on one side of plate 42 and are spaced so as to engage a pair of corresponding terminals 40 extending from two adjacent battery modules 18. A spring clamp 62 (illustrated in perspective in FIG. 1A), which may be substantially U-shaped in cross-section, is preferably disposed within each of female-type terminals 44, 46 of each interface 20 to secure terminals 40(−) and 40(+) therein.

Spring clips 62 may be formed from louvered, stamped beryllium copper for achieving both electrical conduction and a predetermined level of resiliency (i.e., spring action).

Buss blade portion So is provided to electrically couple an electrical node within the string of series-connected battery modules 18 to flexible circuit 22 as described in greater detail hereinafter.

The incorporation of buss interfaces 20 into battery pack 10 is advantageous for several reasons. First, interface 20 provides a relatively compact and efficient means for establishing module 18 to module 18 power connections while allowing flexible circuit 22 to sense discrete voltage levels at each module-to-module interface (node). Second, interfaces 20 provide a means to align modules 18 within battery pack 10. Each module 18 may be placed in case 12 so that the module's male terminals 40 slide within corresponding female terminals 44 and 46 on interface 20.

Flexible printed circuit 22 is provided to establish electrical connectivity between each cell-to-cell node and controller to enable measurements of voltage levels and other parameters within battery pack 10. Flexible printed circuit also is provided to collect and distribute electrical signals between various sensors within battery pack 10 and controller 16. Circuit 22 preferably has a relatively flexible substrate and may be made from the material sold under the registered trademark "MYLAR" by E. I. DuPont DeNemours & Co. of Wilmington, Del.

Referring to FIG. 2, flexible printed circuit 22 may include slits 64 surrounded by a conductive pad 65, a temperatures sensor 66, a resistor 68, a fuse 70 and a surface mounted mass-termination connector 72. In accordance with the present invention, circuit 22 may also include a plurality of airflow openings 74.

Slits 64 are provided to receive a terminal or other conductive insert. In particular, in a battery pack 10 in accordance with a first embodiment of the present invention, each slit 64 is configured to receive a corresponding one of buss blades 50 extending from a respective buss interface 20. Slits 64 may be disposed in registry with, or otherwise correspond to, apertures within case 12 and tray 14 as described in greater detail hereinbelow. In the illustrated embodiment, each slit 64 has a substantially squared S-shape. A conductive trace 76 (which may be copper) extends from pad 65 to connector 72 to electrically couple a respective buss blade 50 (i.e., when inserted and in contact with a respective conductive pad 65) to controller 16. More particularly, when inserted, each "flap" of the "S" shape bears on an opposing side of blade 50. Since the pad 65 is conductive (e.g., copper), the electrical connection is established. In this fashion, each node in the series-connected string of battery modules 18 may be separately, electrically connected to connector 72 (e.g., for voltage sensing). Although the illustrated embodiment incorporates a slit 64 having a substantially squared S-shape, it should be understood that slits 64 could assume a variety of shapes (including, but not limited to, a backwards squared S-shape or an I-shape).

Temperatures sensor 66 is provided to measure the ambient air temperature within battery pack 10. Sensor 66 may comprise conventional temperature sensors known in the art and additional sensors 66 may be disposed at various locations on circuit 22 to obtain desired temperature measurements throughout battery pack 10.

Resistor 68 is provided to limit the current transmitted to controller 16 from buss blade 50 to protect the internal circuits of controller 16. Resistor 68 is conventional in the art and it will be understood by those in the art that current limiting devices other than resistor 68 may be used to perform the same function. It should also be understood that, although only one resistor 68 is illustrated in FIG. 2, additional resistors 68 may be connected between each pad 65, and terminal on connector 72.

Fuse 70 is provided to interrupt the current transmitted to controller 16 from buss blade 50 if the current exceeds a predetermined threshold. Fuse 70 is conventional in the art. Again, it should be understood that, although only one fuse 70 is illustrated in FIG. 2, additional fuses 70 may be connected between each pad 65, and respective terminal on connector 72. It should also be understood that both fuses 70 and resistors 68 may be connected in series between pad 65, and respective terminal on connector 72.

Connector 72 is provided to transmit electrical signals between circuit 22 and controller 16. Connector 72 is conventional in the art and may be mounted to the surface of circuit 22. Connector 72 may comprise one of a pin or socket type connector with controller 16 including a corresponding mating connector (not shown).

Airflow openings 74 are provided to distribute air around and between modules 18 and throughout case 12 generally. In the illustrated embodiment, openings 74 are rectangular in shape and extend through circuit 22. It should be understood, however, that the shape of openings 74 may vary. In a preferred embodiment, openings 74 vary in size relative to each opening's proximity to an air source such as a fan (not shown). In particular, the smallest opening (designated 74S in FIG. 2) may be closest to the air source (where air pressure is greatest) while the largest opening (designated 74L in FIG. 2) may be farthest from the air source (where air pressure is least). This arrangement promotes uniform airflow throughout battery pack 10.

The incorporation of airflow openings 74 within flexible circuit 22 represents a significant improvement relative to conventional batteries because case 12 and/or tray 14 do not have to be specially molded to control distribution of airflow. As a result, the complexity and cost of case 12 and/or tray 14 is significantly reduced. Moreover, adjustments may be made more easily to flexible circuit 22 than to case 12 and/or tray 14 to account for desired changes in airflow distribution. In particular, the size of openings 74 may be increased by cutting away additional portions of the substrate of circuit 22.

Referring to FIG. 3, the intersection of case 12, flexible printed circuit 22, and blade 50 of a buss interface 20 will be described. Although FIG. 3 does not illustrate tray 14 of battery pack 10, it should be understood by those in the art that if tray 14 is included in battery pack 10, tray 14 could alternately be configured in the manner described and illustrated hereinafter with respect to case 12. Case 12 may include an aperture 78 and a resiliently flexible member disposed about aperture 78, such as a lip or arms 80, 82. Aperture 78 is configured to receive buss blade 50 extending from buss interface 20 and may be aligned with one of the conductive pads 65 and one of the slits 64 formed on the film of flex circuit 22. As buss blade 50 is inserted through slit 64 of circuit 22 and aperture 78, arms 80, 82 deflect outwardly. Thereafter, arms 80, 82 exert a force against blade 50 through the flaps of conductive pad 65 to mechanically secure blade 50 within battery pack 10. The conductive pad portion 65 makes a positive electrical contact with bus blade 50.

Referring now to FIG. 4A, a portion of a second embodiment of a battery pack 10' in accordance with the present invention will be described. Like battery pack 10, battery pack 10' may include a case 12, tray 14, controller 16, and flexible printed circuit 22. Battery pack 10' may also include a plurality of battery modules, such as modules 118A, 118B, and a plurality of buss interfaces, such as interface 120.

Like modules 18, modules 118A, 118B provide power to electrical systems external to battery pack 10 and may comprise lithium polymer batteries, nickel cadmium batteries, nickel metal hydride batteries or other conventional batteries. The orientation of modules 118A, 118B in battery pack 10', however, differs from the orientation of modules 18 in battery pack 10. In battery pack 10', modules 118A, 118B are oriented such that an end of module 118A having terminals 140A faces an end of module 118B having terminals 140B.

Buss interface 120 comprising a female-type terminal connector is provided to electrically couple module 118A to module 118B and may be made from an electrically conductive material such as copper or brass. Interface 120 has a body portion shaped to define first and second openings adapted to receive corresponding male-type terminals of battery modules 140A, 140B. In the illustrated embodiment, interface 120 is substantially S-shaped. A U-shaped spring insert 62 may be disposed in each bight portion of interface 120.

FIG. 4B shows a side, plan view of a terminal finger 140B, clip 62, buss interface 120, flex circuit 22, and case 12. In this orientation, downward force on the battery module effects (i) the power connection via interface 120 and (ii) the signal connection via flex circuit 22.

Referring to FIG. 5, a terminal 140A of module 118A may be secured within one bight portion of interface 120 while a terminal 140B of module 118B may be secured in another bight portion of interface 120 to establish an electrical power connection between module 118A and module 118B. It should be understood that additional interfaces 120 may be used to connect additional corresponding terminals on modules 118A, 118B. One or both of the terminals 140A, 140B may extend to contact pad 65 disposed on flexible circuit 22 thereby allowing controller 16, via circuit 22, to perform voltage sensing with respect to each of modules 118A, 118B.

Although FIGS. 4A–4B, and FIG. 5 do not illustrate tray 14 of battery pack 10', it should be understood by those in the art that if tray 14 is included in battery pack 10', tray 14 could alternately be configured in the manner described and illustrated hereinafter with respect to case 12.

We claim:

1. A battery pack, comprising:

a case;

a flexible circuit supported within said case;

a first battery module electrically connected to said flexible circuit; and characterized in that said flexible circuit includes a plurality of airflow openings extending therethrough wherein a first airflow opening of said plurality of airflow opening differs in size from a second airflow opening of said plurality of airflow openings.

2. A battery pack, comprising:

a case;

a flexible circuit supported within said case;

a first battery module electrically connected to said flexible circuit; and characterized in that said flexible circuit includes a plurality of airflow openings extending therethrough wherein the size of each one of the said plurality of airflow openings varies relative to a distance between said one airflow opening and an air source.

* * * * *